United States Patent
Flores et al.

(10) Patent No.: US 10,813,235 B2
(45) Date of Patent: Oct. 20, 2020

(54) CONSTRUCTIVE ARRANGEMENT INTRODUCED IN A HOUSING FOR ELECTRONIC CIRCUIT WITH POWER COMPONENTS

(71) Applicant: Embraco Industria De Compressores E Solucoes Em Refrigeracao Ltda., Joinville (BR)

(72) Inventors: Gustavo Ceretta Flores, Joinville (BR); Vagner Roberto Malon, Joinville (BR); Kellen de Almeida Foschiera, Joinville (BR)

(73) Assignee: Embraco Industria De Compressores E Solucoes EM Refrigeracao LTDA., Joinville-SC (BR)

( * ) Notice: Subject to any disclaimer, the term of this patent is extended or adjusted under 35 U.S.C. 154(b) by 0 days.

(21) Appl. No.: 16/576,866

(22) Filed: Sep. 20, 2019

(65) Prior Publication Data

US 2020/0245482 A1    Jul. 30, 2020

(30) Foreign Application Priority Data

Jan. 28, 2019    (BR) ...................... 20 2019 001684 7

(51) Int. Cl.
*H05K 7/20* (2006.01)
*H05K 5/02* (2006.01)

(52) U.S. Cl.
CPC ....... *H05K 5/0247* (2013.01); *H05K 7/20918* (2013.01)

(58) Field of Classification Search
CPC ..... H01L 2924/00014; H01L 2924/181; H01L 2225/06589; H01L 2023/4062; H05K 7/20854; H05K 13/00; H05K 1/181; H05K 1/0203; H05K 7/209; H05K 2201/066; H05K 7/20963; H05K 9/0037; F28F 3/00; F28F 3/02
USPC .......... 361/752, 704, 707, 679.01, 709, 714, 361/720, 748, 601, 688, 697, 736, 796, 361/810, 829; 174/252, 260, 377, 67; 165/80.2; 257/706, 728
See application file for complete search history.

(56) References Cited

U.S. PATENT DOCUMENTS

2018/0042101 A1*    2/2018    Avalos ............... H05K 7/20854

* cited by examiner

*Primary Examiner* — Mandeep S Buttar
(74) *Attorney, Agent, or Firm* — Harrington & Smith

(57) ABSTRACT

A constructive arrangement introduced in a housing for electronic circuit with power components is disclosed, in which a modular frame structure is provided, capable of being attached to the main structural frame and responsible for receiving the heat sink element. Said frame structure further includes holes bordered by contour walls, which optimize the application of high thermal conductivity coefficient resin between the electrical/electronic power components of the circuit board and the heat sink element.

5 Claims, 2 Drawing Sheets

CONSTRUCTIVE ARRANGEMENT INTRODUCED IN A HOUSING FOR ELECTRONIC CIRCUIT WITH POWER COMPONENTS

FIELD OF THE UTILITY MODEL

The present utility model refers to a constructive arrangement introduced in a housing for electronic circuit with power components, such as frequency inverters used to control the speed of rotation of alternating current electric motors. Preferably, but never limiting, the object of the utility model in question is applicable to frequency inverters used in refrigeration compressors.

BACKGROUND OF THE UTILITY MODEL

As is well known to those skilled in the art, there are numerous electronic circuits integrated by power components, which necessarily need to be associated with heat sinks.

Among the infinitude of applications of electronic circuits integrated by power components, it is highlighted the frequency inverter circuits used to control the rotation speed of alternating current electric motors. Even more particularly, it is highlighted the frequency inverter circuits specially adapted to control the speed of rotation of alternating current electric motors used in reciprocating compressors employed in refrigeration systems.

Especially in this type of application, wherein the frequency inverter is housed within a housing adapted to be mounted outside the reciprocating compressor casing, there is a complementary need for dissipating heat from the power components, since the housing itself is often subject to a temperature that, influenced by the temperature of the reciprocating compressor casing, is higher than the room temperature.

Accordingly, it is common for housings containing frequency inverters used in reciprocating refrigeration compressors, according to the current state of the art, to have constructions which, somehow or other, are capable of optimizing the heat dissipation of power components. However, most of the currently existing technical solutions, at least in this niche, optimize said heat dissipation of the power components to the detriment of other factors.

In the most widely known technical solution, always in accordance with the knowledge of those skilled in the art, it is common for power components and other electronic components to be arranged in the same plane. In addition, it is common for a normally finned heat sink to be physically associated with power components by means of screws. Additionally, a thermal adhesive (high thermal conductivity coefficient resin) is also used between the entire space between the power components and the heat sink. In general terms, it is this thermal adhesive that optimizes the heat dissipation of the power components and, therefore, this thermal adhesive is used in abundant quantities.

Thus, efficiency is favored over the overall cost of manufacturing, and it is based on this scenario that the present utility model arises.

OBJECTIVES OF THE UTILITY MODEL

Therefore, the present utility model has as its main objective to present a constructive arrangement introduced in a housing for electronic circuit with power components with high heat dissipation capacity and not a high cost of manufacture.

Additionally, it is still one of the objectives of the utility model that the constructive introduced, presently discloses, ensures efficient electrical insulation between the power components and the heat sink element.

Lastly, it is also one of the objectives of the utility model that the housing be easy to assemble and maintain.

SUMMARY OF THE UTILITY MODEL

All of the aforementioned objectives are achieved by means of the constructive arrangement introduced in a housing for electronic circuit with power components, which comprises at least one structural frame (box-shaped, comprising at least one opening), at least one circuit board (comprising at least one electrical/electronic power component) facing the opening of the structural frame, and at least one heat sink element.

According to the utility model in question, at least one frame structure is further provided cooperatively disposed to the opening of the structural frame. Said frame structure comprises at least one hole bordered by contour walls disposed perpendicular to the general plane of said frame structure, and further forms at least one guide rail for the housing the heat sink element disposed around at least one hole bordered by contour walls. In addition, said frame structure is disposed in parallel over the circuit board, the at least one hole being bordered by contour walls aligned with the at least one electrical/electronic power component.

Thus, according to the utility model in question, the entire area bounded by the alignment between at least one hole bordered by contour walls and the region of the circuit board adjacent to the at least one electrical/electronic power component is filled with high thermal conductivity coefficient resin.

Also in this context, according to the utility model in question, the heat sink element is arranged on the guide rail of the frame structure so as to obstruct the at least one hole bordered by contour walls already filled with high thermal conductivity coefficient resin.

BRIEF DESCRIPTION OF THE FIGURES

The preferred embodiment of the utility model in question is described in detail based on the listed figures, which.

DETAILED DESCRIPTION OF THE INVENTION

According to the general concept of the utility model in question, it is disclosed a constructive arrangement introduced in a housing for electronic circuit with power components whose preferred embodiment is illustrated in FIGS. 1 to 4. In this preferred embodiment, which should not be construed as limiting, the object of the utility model in question is particularly applicable to variable speed reciprocating compressors, the electronic circuit with power components being a frequency inverter, which is widely known and has the fundamental function of controlling the rotation speed of the electric motor that incorporates a variable speed reciprocating compressor. Thus, in accordance with this preferred embodiment, said housing for electronic circuit with power components is especially suitable to be attached to the outer face of the hermetic casing of a variable speed reciprocating compressor, said compressor being usually employed in general refrigeration systems.

Figure 1:
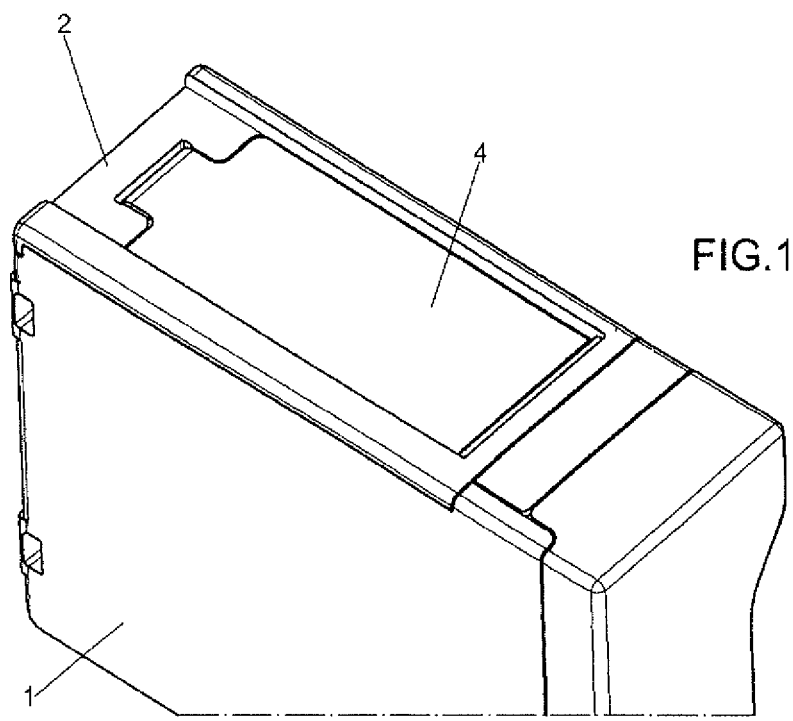
FIG. 1 illustrates, in general perspective, the preferred embodiment of the housing for electronic circuit with power components, according to the utility model in question.

As illustrated in FIG. 1, the housing for electronic circuit with power components, discussed herein, is fundamentally integrated by structural frame 1, a frame structure 2 and a heat sink element 4, wherein within said structural frame 1 is at least one circuit board 3 comprising electrical/electronic power components 31 in need of dedicated cooling, which is especially offered by the heat sink element 4, which preferably comprises a metal plate with high thermal conductivity coefficient.

Figure 3:
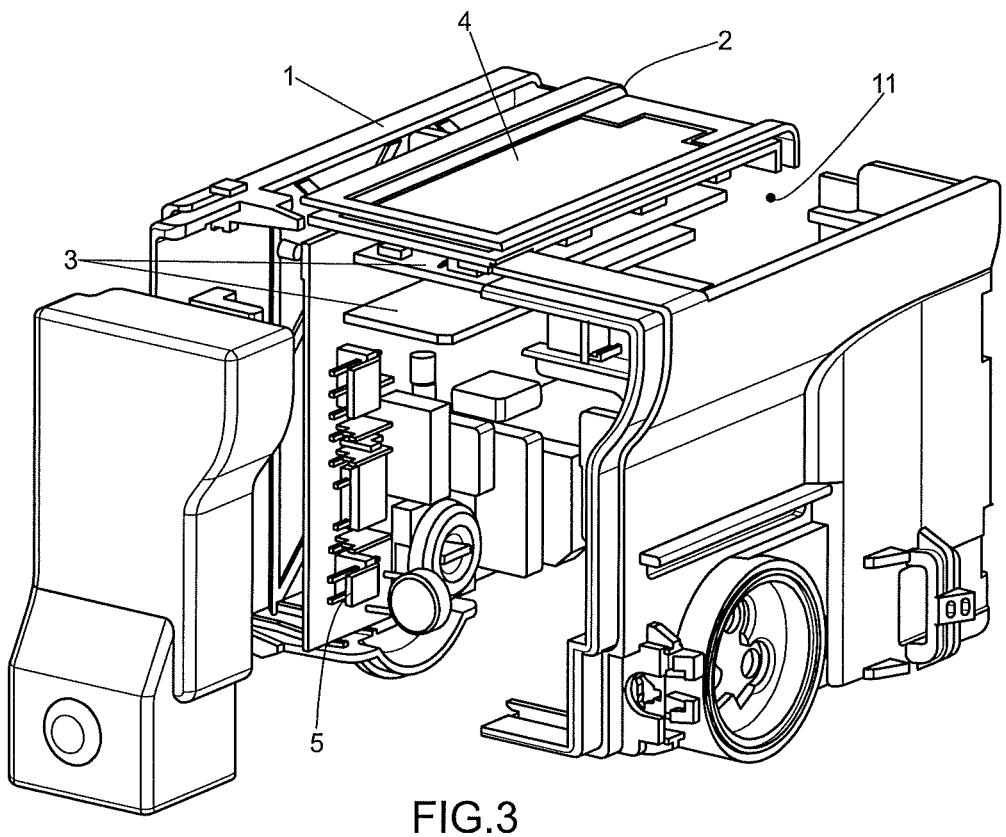

Preferably, as illustrated in FIG. 3, the structural frame 1 comprises a bipartite body which, when properly assembled, defines a box shape.

In addition, the structural frame 1 comprises at least one opening 11—which can arbitrarily be understood as an upper opening—specially designed to cooperatively receive the frame structure 2. This cooperation, or cooperative fitting, can be accomplished by simple fitting as illustrated in FIG. 3. Preferably, the structural frame 1 and the frame structure 2 are both made of polymer.

Figure 2:
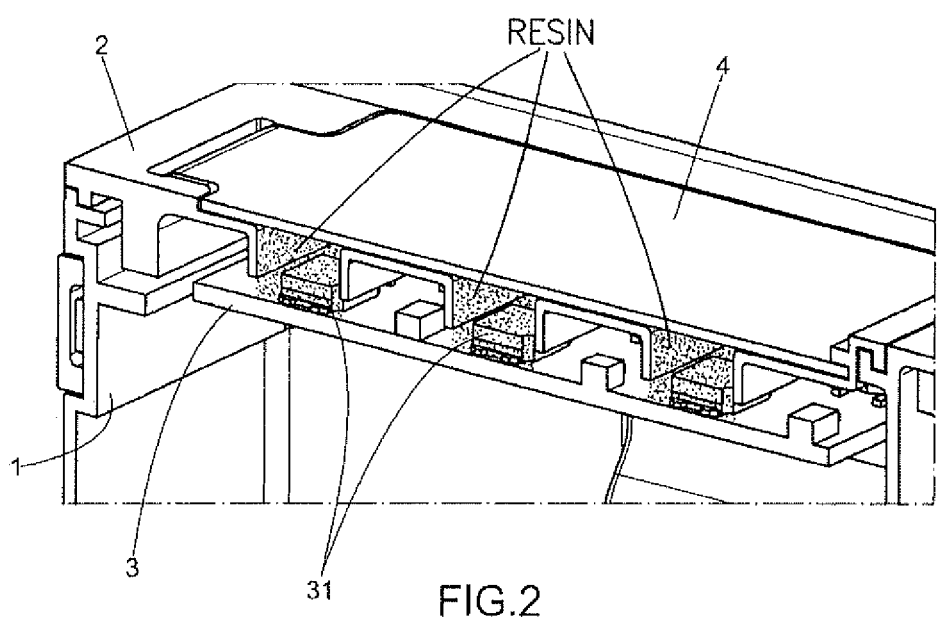
FIGS. 2 and 3 illustrate schematic sections of the housing for electronic circuit with power components of FIG. 1.
Figure 4:
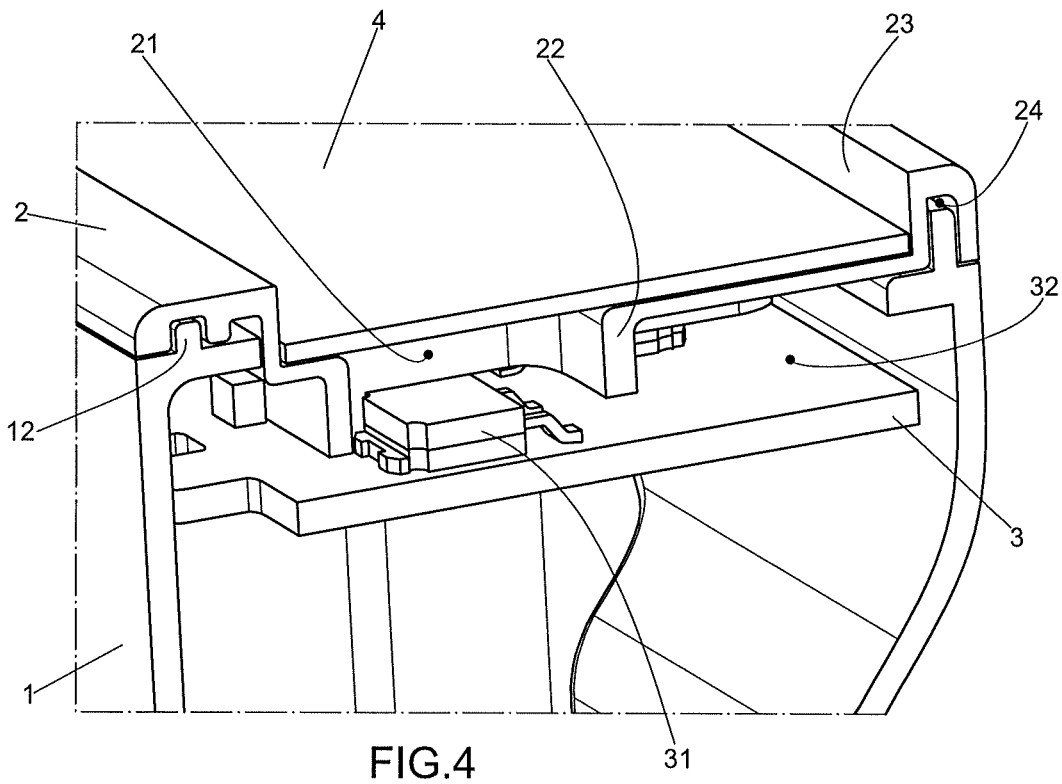
FIG. 4 illustrates, in exploded perspective, the housing for electronic circuit with power components of FIG. 1.

As illustrated in FIGS. 2 and 4, the frame structure 2 comprises multiple holes 21, each of these holes being bordered by contour walls 22 arranged perpendicular to the general plane of said frame structure 2.

Thus, considering that a circuit board 3 faces the opening 11 of the structural frame 1, and in view of the fact that the frame structure 2 is disposed in parallel over the circuit board 3, the holes 21 bordered by contour walls 22 are arranged to be especially aligned with the electrical/electronic power components 31 of the circuit board 3.

Thus, only the entire area bounded by the alignment between a hole 21 bordered by contour walls 22 and the region of the circuit board 3 adjacent to its respective electrical/electronic power component 31 can be, especially dedicated, filled with a high thermal conductivity coefficient resin (traditionally known to those skilled in the art).

This is one of the great merits of the utility model in question, after all, the constructive assembly of the structural frame 1, circuit board 3 and frame structure 2 provided with holes 21 bordered by contour walls 22 ends up allowing a "dedicated fill of thermal resin" in which only the regions of the circuit board 3 adjacent to the electrical/electronic power components 31, in addition to the electrical/electronic power components 31 themselves, have direct contact with the high thermal conductivity coefficient resin. This means that the resin with a high thermal conductivity coefficient has its application focused only in the regions in which there are electrical/electronic power components 31.

Thus, the utility model in question stands out for providing high savings in the amount of resin with a high thermal conductivity coefficient, while maintaining all the appropriate and necessary requirements for the cooling of the electrical/electronic power components 31 of the circuit board 3.

In addition, it is interesting to notice that this constructive concept is essentially modular, after all, different circuit boards 3, with different cooling needs of their electrical/electronic power components 31, can be arranged in structural frames 1 of equivalent sizes, and for this purpose, it is sufficient to adjust the quantity and/or dimensions of the holes 21 bordered by contour walls 22.

Another of the great merits of the utility model in question refers to how the heat sink 4 is mounted relative to the frame structure 2.

As best illustrated in FIGS. 2 and 4, the frame structure 2 further forms at least one guide rail 23 for the housing of the heat sink element 4. Thus, the heat sink 4 can be slidingly fitted and attached to the frame structure 2 without the use of screws, rivets or any other fastening elements. In addition, precisely because it is fitted and attached to the frame structure 2, the heat sink 4 is arranged around the holes 21 bordered by contour walls 22 so as to obstruct the holes 21 bordered by contour walls 22 already filled with high thermal conductivity coefficient resin.

In addition, it is important to highlight that the dielectric distance between at least one electrical/electronic power component 31 and the heat sink element 4 is defined by the height of the contour walls 22 that border their respective hole 21.

The frame structure 2, by comprising a modular body to the structural frame 1 and by uniquely assembling in itself the fastening means of the heat sink 4 and the best conducting means for the electrical/electronic power components 31, it allows disassembly and assembly of the circuit board 3 relative to the structural frame 1, without impairing the integrity of the entire housing for electronic circuit with power components.

Also in accordance with the preferred embodiment of the utility model in question, as regards cooperation between the frame structure 2 and the structural frame 1, it is noted that the opening 11 of the structural frame 1 is bordered by a fitting rib 12 and the frame structure 2 is bordered by a fitting groove 24. Thus, said fitting rib 12 and said fitting groove 24 cooperate with one another in order to promote the attachment of the frame structure 2 to the structural frame 1.

As illustrated in FIG. 3, it is further noticed that, optionally, the circuit board 3 comprising the electrical/electronic power components 31 may be of a possible main circuit board 5. In this configuration, which optimizes the technical advantages of the utility model in question, the circuit board 3 is disposed, when connected to the main circuit board 5, perpendicular to it.

It is important to emphasize that the above description has the sole purpose of describing, in an exemplary manner, the particular embodiment of the present utility model. Therefore, it is clear that constructive modifications, variations and combinations of the elements that perform the same function in substantially the same manner to achieve the same results, remain within the scope of protection delimited by the appended claims.

The invention claimed is:

1. Constructive arrangement introduced in a housing for electronic circuit with power components, comprising:
   at least one box-shaped structural frame comprising at least one opening;
   at least one circuit board comprising at least one electrical/electronic power component facing the opening of the structural frame;
   at least one heat sink element;
   the constructive arrangement introduced in a housing for electronic circuit with power components being characterized by the fact that:
   it is further provided at least one frame structure cooperatively disposed to the opening of the structural frame;
   said frame structure comprising at least one hole bordered by contour walls disposed perpendicular to the general plane of said frame structure;

said frame structure further forming at least one guide rail for the housing the heat sink element disposed around at least one hole bordered by contour walls;

said frame structure being disposed in parallel over the circuit board, the at least one hole being bordered by contour walls aligned with the at least one electrical/electronic power component;

the entire area bounded by the alignment between at least one hole bordered by contour walls and the region of the circuit board adjacent to the at least one electrical/electronic power component being filled with high thermal conductivity coefficient resin;

the heat sink element being arranged on the guide rail of the frame structure so as to obstruct the at least one hole bordered by contour walls already filled with high thermal conductivity coefficient resin.

2. Constructive arrangement introduced in a housing for electronic circuit with power components according to claim 1, characterized by the fact that:

the opening of the structural frame is bordered by a fitting rib;

the frame structure is bordered by a fitting groove;

said fitting rib and said fitting groove are cooperating with one another in order to promote the attachment of the frame structure to the structural frame.

3. Constructive arrangement introduced in a housing for electronic circuit with power components according to claim 1, characterized by the fact that it comprises:

at least one main circuit board disassociated from the circuit board, wherein said circuit board is, when connected to the main circuit board, disposed perpendicular to the latter.

4. Constructive arrangement introduced in a housing for electronic circuit with power components according to claim 1, characterized by the fact that the high thermal conductivity coefficient resin has its application focused only in the regions where there are electrical/electronic power components.

5. Constructive arrangement introduced in a housing for electronic circuit with power components according to claim 1, characterized by the fact that the dielectric distance between at least one electrical/electronic power component and the heat sink element is defined by the height of the contour walls that border their respective hole.

* * * * *